(12) United States Patent
Kikuchi et al.

(10) Patent No.: US 6,740,932 B2
(45) Date of Patent: May 25, 2004

(54) SEMICONDUCTOR DEVICE FOR IMPROVING SUSTAINING VOLTAGE

(75) Inventors: Shuichi Kikuchi, Gunma (JP); Eiji Nishibe, Gunma (JP); Takuya Suzuki, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/837,397

(22) Filed: Apr. 18, 2001

(65) Prior Publication Data

US 2002/0125531 A1 Sep. 12, 2002

(30) Foreign Application Priority Data

Mar. 6, 2001 (JP) .................... P. 2001-061440

(51) Int. Cl.$^7$ .................... H01L 29/76; H01L 29/94; H01L 31/062; H01L 31/113; H01L 31/119
(52) U.S. Cl. .................... 257/344; 257/335; 257/336; 257/344; 257/408; 257/213
(58) Field of Search .................... 257/217, 328, 257/335, 336, 344, 346, 355, 356, 408, 409

(56) References Cited

U.S. PATENT DOCUMENTS

| | | | |
|---|---|---|---|
| 5,517,046 A | * | 5/1996 | Hsing et al. .................... 257/336 |
| 5,541,435 A | * | 7/1996 | Beasom .................... 257/409 |
| 5,578,514 A | * | 11/1996 | Kwon et al. .................... 437/41 |
| 2002/0094642 A1 | * | 7/2002 | Kikuchi et al. .................... 438/268 |
| 2003/0006457 A1 | * | 1/2003 | Nishinohara .................... 257/330 |

FOREIGN PATENT DOCUMENTS

JP 402280342 * 11/1990 .......... H01L/21/336

* cited by examiner

*Primary Examiner*—Amir Zarabian
*Assistant Examiner*—Monica Lewis
(74) *Attorney, Agent, or Firm*—Fish & Richardson P.C.

(57) ABSTRACT

A semiconductor device has a gate electrode formed on P type semiconductor substrate through a gate insulation film, a low concentration N− type drain region formed so as to be adjacent to the gate electrode, a high concentration N+ type drain region separated from the other end of said gate electrode and included in said low N− type drain region, and a middle concentration N type layer at a region spanning at least from said gate electrode to said high concentration N+ type drain region, and formed so that impurity concentration becomes low at a region near the gate electrode.

6 Claims, 8 Drawing Sheets

SEMICONDUCTOR DEVICE FOR IMPROVING SUSTAINING VOLTAGE

BACKGROUND OF THE INVENTION

1. Field of the Invention

The present invention relates to a semiconductor device and a method of manufacturing the device, particularly to technique improving operation sustaining voltage characteristic of high sustaining voltage MOS transistor for high voltage of power source (HV-VDD) used for an LCD driver, an EL driver and so on.

2. Description of the related Art

A semiconductor device according to the related art will be described below referring a section view of an LDD type high sustaining voltage MOS transistor shown in FIG. 10.

Figure 10:
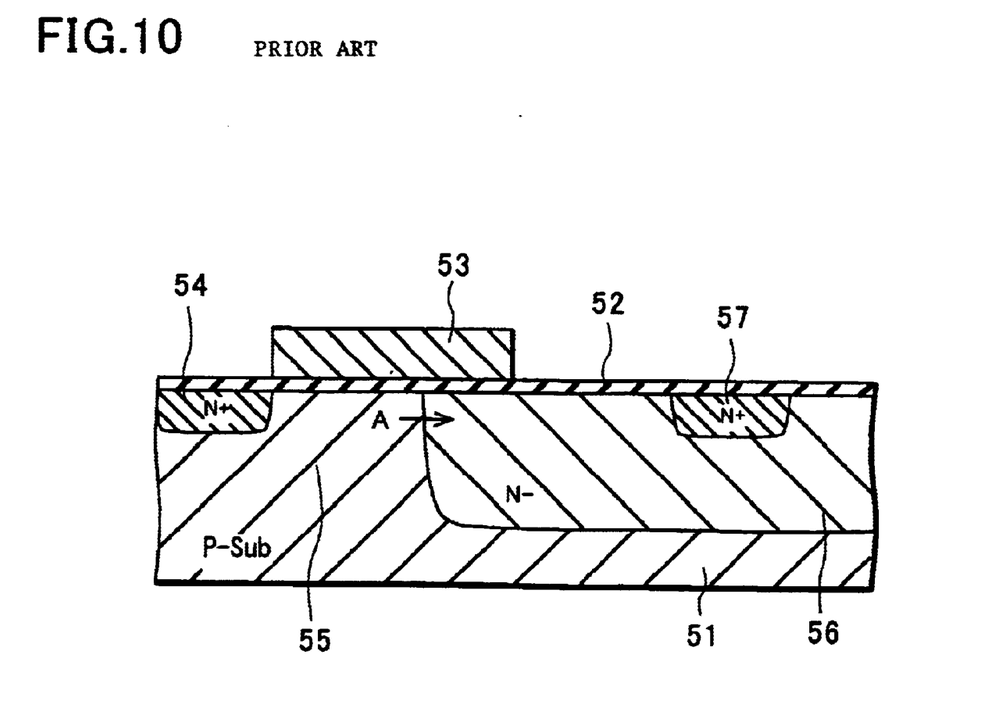
FIG. 10 is a section view showing the conventional semiconductor device.

In FIG. 10, a gate electrode 53 is formed on a P type semiconductor substrate (P-Sub) 51 through a gate insulation film 52. An N+ type source region 54 is formed so as to be adjacent to one end of said gate electrode 53, an N− type drain region 56 is formed facing said source region 54 through a channel region and further separated from the other end of the gate electrode 53, and an N+ type drain region 57 is formed so as to be included in an N− type drain region 56.

In the prior art, a low concentration N− type drain region 56 is formed by thermal diffusion of about 1000° C. to 1100° C. so as to form a gentle slope and a deep diffusion layer.

However, even with such the construction, voltage between source and drain (BVDS: sustaining voltage at OFF) is high, but sustaining voltage (VSUS: sustaining voltage at ON) being operation sustaining voltage of the voltage is about 30 V at most in the prior art.

A mechanism decreasing the above-mentioned operation sustaining voltage will be described below.

Figure 11:
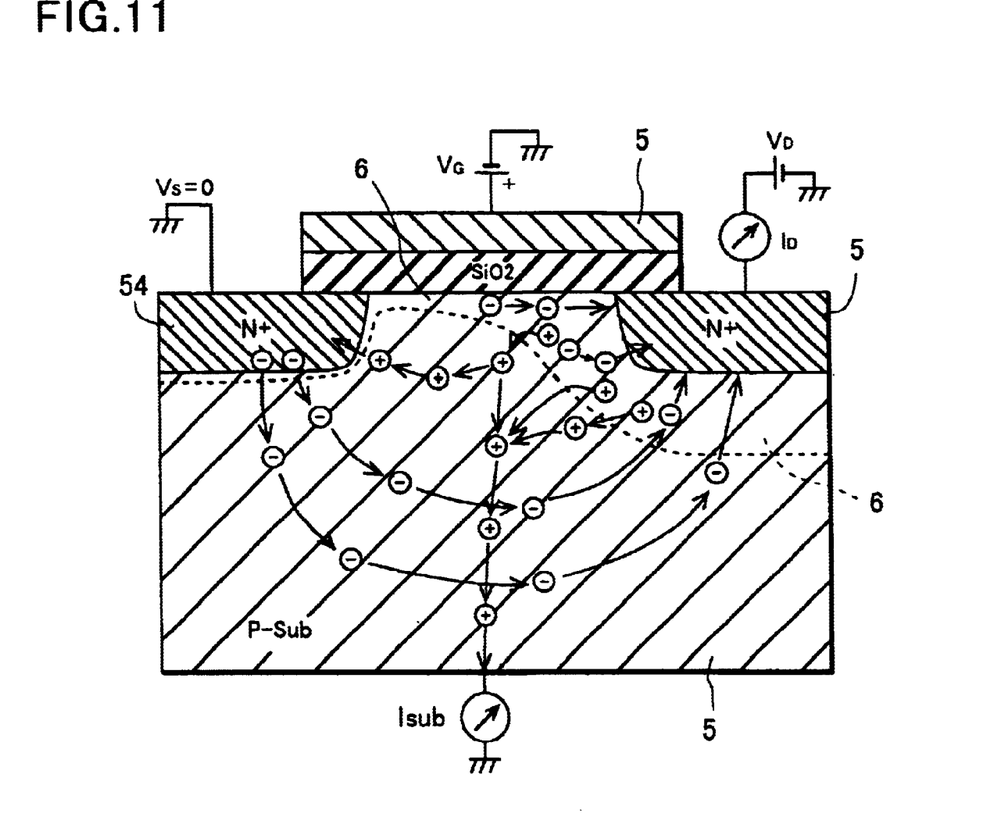
FIG. 11 is a section view of the semiconductor device for describing the mechanism of the conventional operation sustaining voltage drop.
Figure 12:
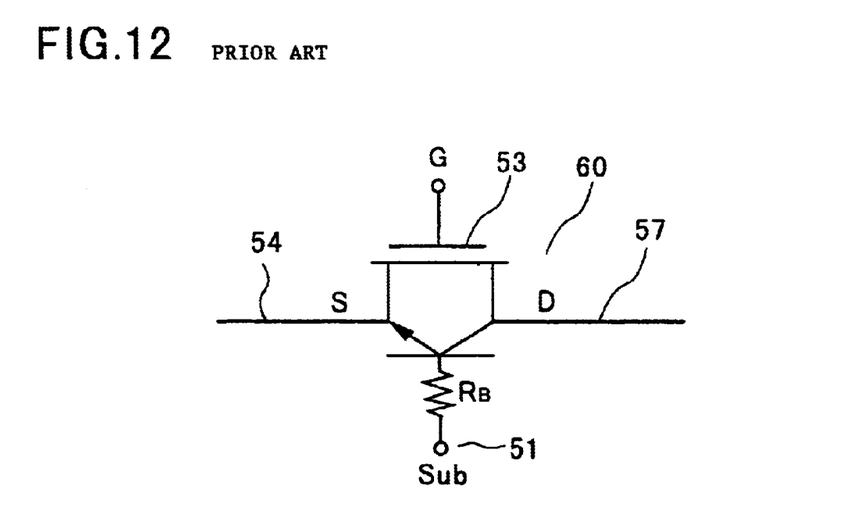
FIG. 12 is a view showing the equivalent circuit of the conventional parasitic bipolar transistor.
Figure 13:
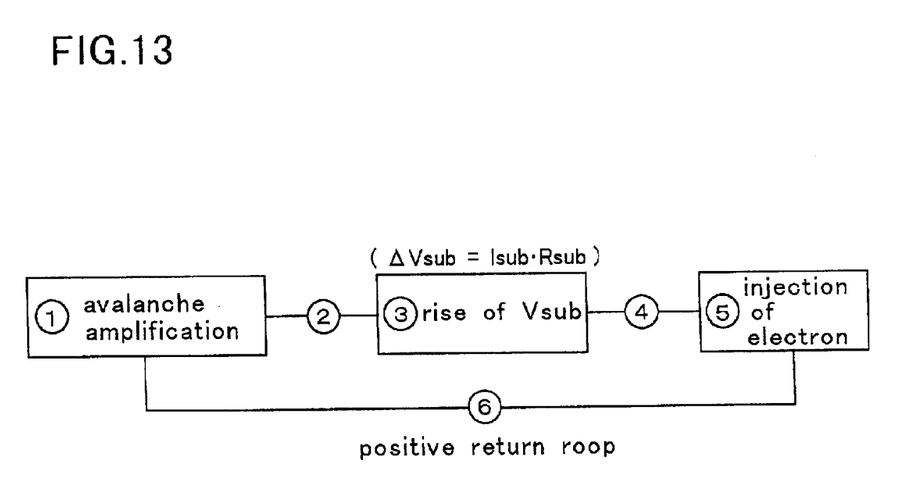
FIG. 13 is a view showing positive feedback loop for describing the mechanism of the conventional operation sustaining voltage drop.

In such the N channel type high sustaining voltage MOS transistor, a horizontal bipolar transistor 60 having the drain region 57 as corrector (N+), the source region 54 as emitter (N+), and the semiconductor substrate 51 as base (P) is formed parasitically as shown in FIG. 11 and FIG. 12. Decreasing of operation sustaining voltage VSUS even if voltage between source and drain BVDS being sustaining voltage at OFF is high is caused by ON of the parasitical bipolar transistor 60. Thus, operation range of the N channel type high sustaining voltage MOS transistor is limited and operation at all over the range is difficult.

An operation of said bipolar transistor 60 will be described below.

AS shown in FIG. 11, gate voltage (VG)(>Vt: threshold voltage) is added to the gate electrode 53, voltage of a drain electrode (VD)(>>VG) contacting the drain region 57 is added, and a positive feedback loop described later (refer FIG. 12) is formed in the case of ON of the MOS transistor.

That is, ① avalanche multiplication generates in a depletion layer by electron of a channel region 62 accelerated at a depletion layer near the drain region 57 so as to generate a pair of an electron and a hole. ② Said hole flows in the substrate (substrate current: ISub) ③ Said substrate current (ISub) generates voltage slope in the semiconductor substrate 51 to raise substrate voltage. ④ Junction between the source region 54 and the substrate 51 is biased to forward direction. ⑤ Electron is implanted from the source region 54 to the substrate 51. ⑥ The implanted electron reaches the drain region 57 and further occurs avalanche multiplication.

Thus, by forming the positive feedback of ① to ⑥, large current flows in the device so as to break the device.

Therefore, in design of the N channel type high sustaining voltage MOS transistor, conditions of the design is set considering the above-mentioned phenomenon. First, a transistor construction decreasing substrate current (ISub) is adopted because operation sustaining voltage (VSUS) becomes small as substrate current (ISub) becomes large, and second, the conditions are decided so as to decrease substrate current (ISub) at an actually used region.

Figure 4:
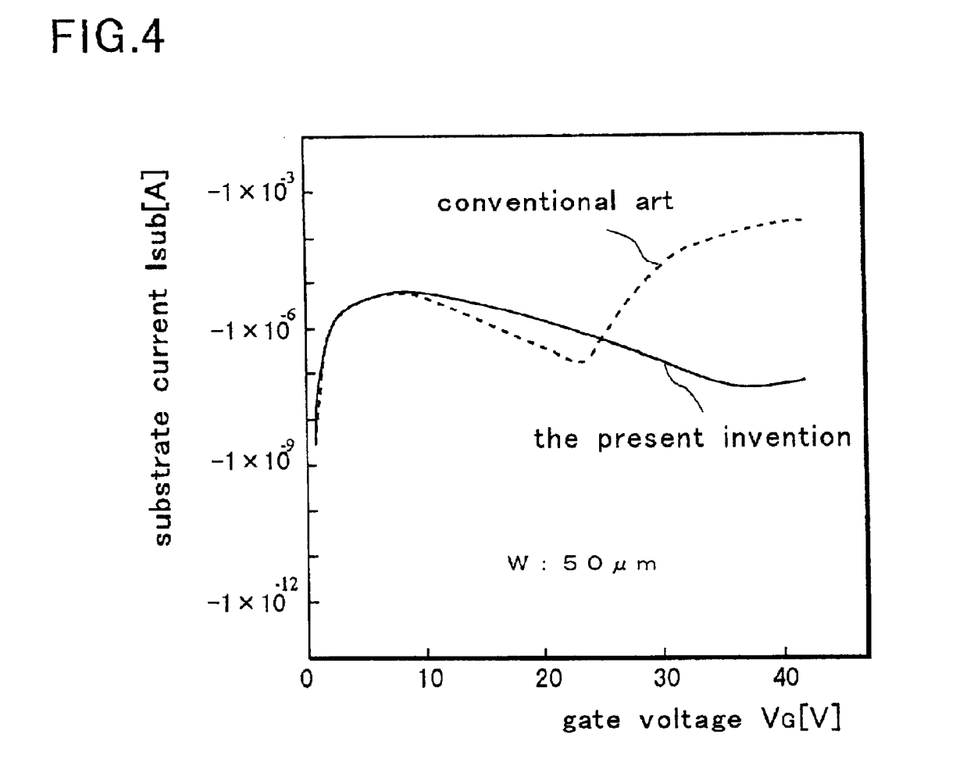
FIG. 4 is a view showing substrate current (ISub) vs. gate voltage (VG) of a semiconductor device of the invention and the conventional semiconductor device.

FIG. 4 is a substrate current (ISub) vs. gate voltage (VG) characteristic view, in the figure, double humps characteristic of substrate current (ISub) at high region in gate voltage (VG) rises about the conventional N channel type high sustaining voltage MOS transistor (shown with a dotted line in the figure). Therefore, operation sustaining voltage (VSUS) is low shown in drain current (ID) vs. drain voltage (VD) characteristic view of FIG. 5 and a characteristic view showing operation sustaining voltage of FIG. 6.

The double humps characteristic is caused by concentration of electric field by spreading the depletion layer near the N+ drain region at high region in gate voltage (VG).

Figure 6:
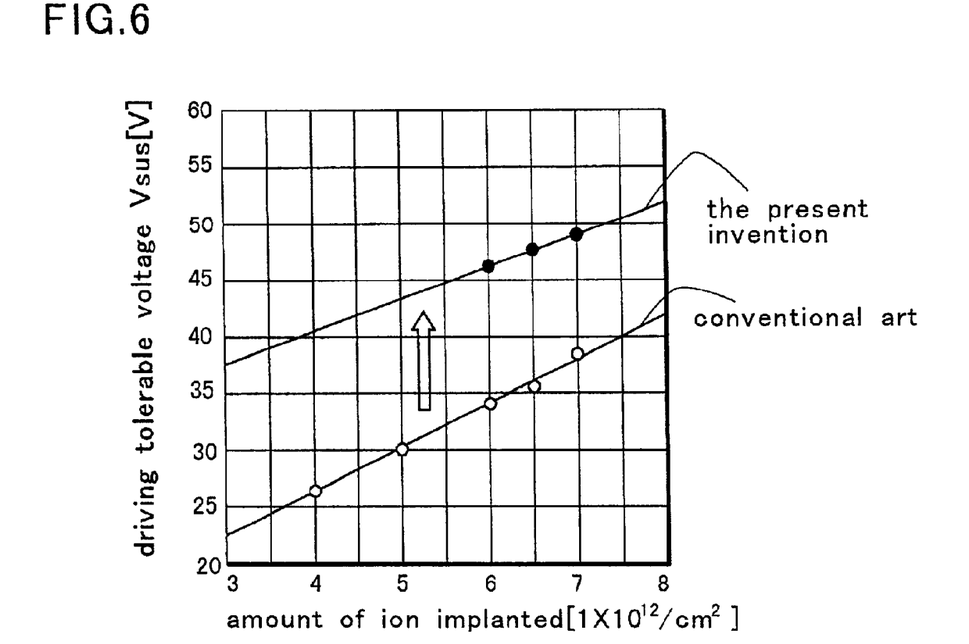
FIG. 6 is a view showing operation sustaining voltage of a semiconductor device of the invention and the conventional semiconductor device.

Although it is considered to increase ion implantation volume(doze) and to rise concentration of N− type drain region as shown in FIG. 6 to improve operation sustaining voltage (VSUS), the conventional semiconductor device is not improved enough in sustaining voltage as shown with white circles. Because concentration of end portion A of the N− type drain region 56 shown in FIG. 12 rises conversely, problems of increase of short channel effect by that depletion layer spreads to the channel region 55 direction, increase of snap back phenomenon by increase of peak value of substrate current (ISub), and further decrease of voltage between source and drain (BVDS) occur. Therefore, there is not effective means improving operation-sustaining voltage.

SUMMARY OF THE INVENTION

Therefore, an object of the invention is to provide a semiconductor device capable of improving operation sustaining voltage and a method of manufacturing the device.

A semiconductor device of the invention has a gate electrode formed on at least one conductive type semiconductor substrate through a gate insulation film, a low concentration reverse conductive type drain region formed so as to be adjacent to the gate electrode, a high concentration reverse conductive type drain region separated from the other end of said gate electrode and included in said low concentration reverse conductive type drain region, and a middle concentration reverse conductive type layer having a lower impurity concentration near the gate electrode than said high concentration reverse conductive type drain region, said middle concentration reverse conductive type layer is formed at a region spanning at least from said gate electrode to said high concentration reverse conductive type drain region. Therefore, the semiconductor device is characterized in improving operation-sustaining voltage.

Preferably said middle concentration reverse conductive type layer is formed at a region spanning at least from said gate electrode to said high concentration reverse conductive type drain region so that the impurity concentration gradually becomes high from said gate electrode to said high concentration reverse conductive type drain region or said high impurity concentration reverse conductive type source and drain region.

Preferably said middle concentration reverse conductive type layer is formed at a region spanning at least from said gate electrode to said high concentration reverse conductive type drain region so that the impurity concentration becomes high step by step from said gate electrode to said high concentration reverse conductive type drain region or said high impurity concentration reverse conductive type source and drain region.

A method of manufacturing a semiconductor device has processes of forming a low concentration reverse conductive type drain region on at least one conductive type semiconductor substrate, forming a gate insulation film at the entire surface of said semiconductor substrate, forming a gate electrode overlapping at least upper side of said drain region by patterning after forming a conductive film on the entire surface, forming a high concentration reverse conductive type source region adjacent to one end of said gate electrode and a high concentration reverse conductive type drain region separated from the other end of said gate electrode and included in said low concentration reverse conductive type drain region, and forming a middle concentration reverse conductive type layer formed at a region spanning from said gate electrode to said high concentration reverse conductive type drain region or said high impurity concentration reverse conductive type source and drain region so that impurity concentration becomes low near gate electrode.(lower than said high impurity concentration reverse conductive type source and drain region)

Said middle concentration reverse conductive type layer is formed at a region spanning from the gate electrode to said high concentration reverse conductive type drain region or said high impurity concentration reverse conductive type source and drain region by ion implantation from oblique upper side by using a photoresist covering the gate electrode as a mask at said forming process of the middle concentration reverse conductive type layer.

Said middle concentration reverse conductive type layer is formed at a region spanning from the gate electrode to said high concentration reverse conductive type drain region or said high impurity concentration reverse conductive type source and drain region by ion implantation so as to penetrate a side wall insulating film formed on a side wall of the gate electrode, having a tapered shape at said forming process of the middle concentration reverse conductive type layer.

DETAILED DESCRIPTION OF THE PREFERRED EMBODIMENTS

Embodiments of a semiconductor device and a method of manufacturing the same of the invention will be described below referring figures.

Figure 3:
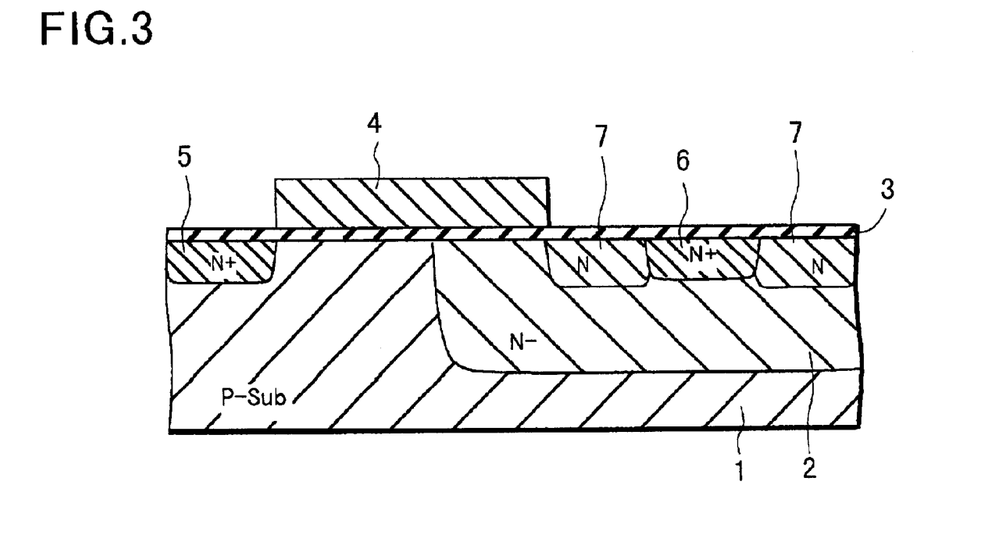
FIG. 3 is a third section view showing a method of manufacturing a semiconductor device of a first embodiment of the present invention.

In a semiconductor device of a first embodiment according to the invention, a gate insulation film 3 is formed on one conductive type semiconductor substrate, for example, P type semiconductor substrate 1, and a gate electrode 4 is formed through the gate insulation film 3 as FIG. 3. A high concentration reverse conductive (N+) type source region 5 is formed so as to be adjacent to one end of said gate electrode 4, a low concentration reverse conductive (N−) type drain region 2 is formed so as to face said source region 5 through a channel region under the gate electrode 4, and further, a high concentration reverse conductive (N+) type drain region 6 is formed so as to be separated from the other end of said gate electrode 4 and included in said low concentration N− type drain region 2. A middle concentration reverse conductive (N) type layer 7 is formed at a region spanning at least from said gate electrode 4 to said high concentration N+ type drain region 6. Said N type layer 7 has high impurity concentration peak at a position of the predetermined depth in said substrate, and is formed so that high impurity concentration becomes low at region near surface of the substrate.

A method of manufacturing the above-mentioned semiconductor device will be described below.

Figure 1:
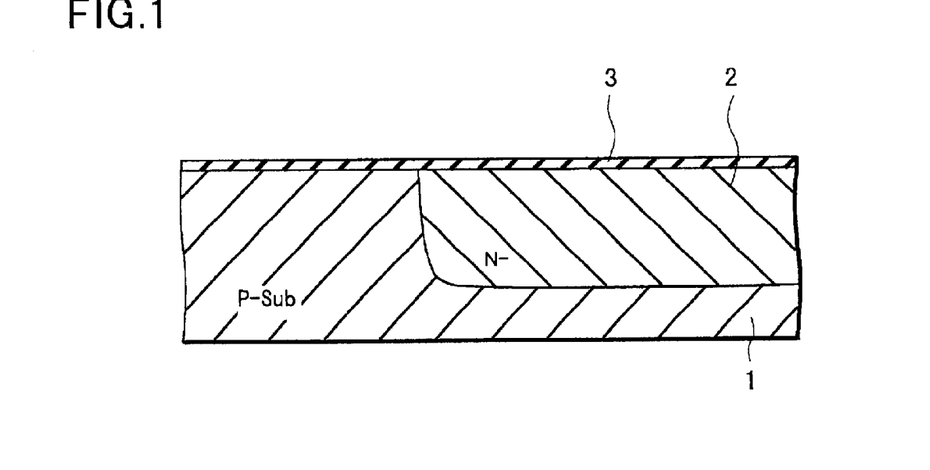
FIG. 1 is a first section view showing a method of manufacturing a semiconductor device of a first embodiment of the present invention.

First, N type impurity, for example, phosphorus ion ($^{31}P^+$) is ion-implanted into a P type silicon substrate 1 with 100 KeV in acceleration voltage and $6 \times 10^{12}/cm^2$ in implantation volume, an N− type drain region 2 is formed by thermal diffusion with 1100° C., 2 hours, and after that, a gate insulation film 3 of 100 nm thickness is formed by thermal oxidation on said substrate 1 as shown in FIG. 1.

Figure 2:
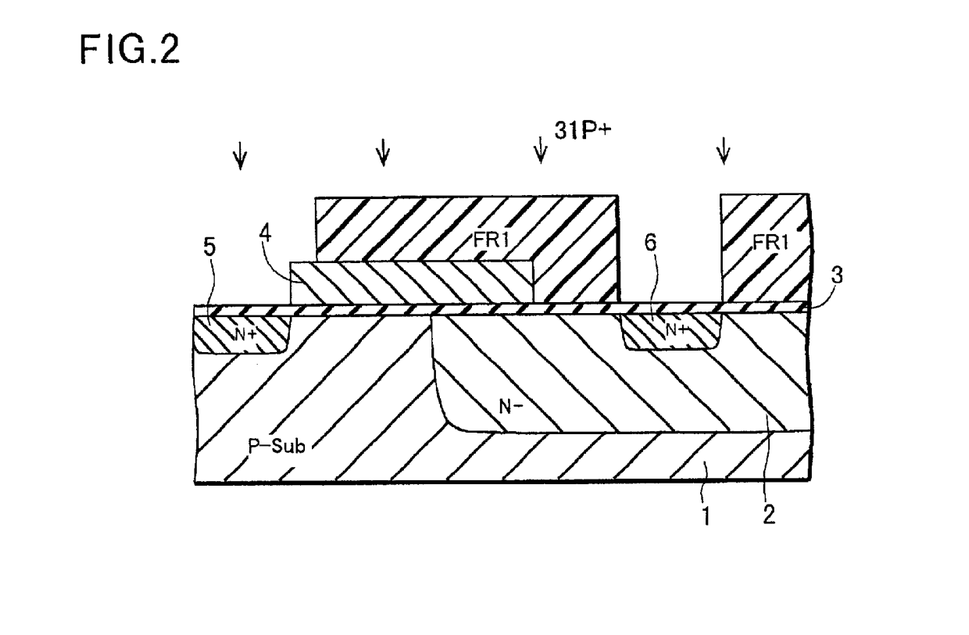
FIG. 2 is a second section view showing a method of manufacturing a semiconductor device of a first embodiment of the present invention.

Next, after forming a conductive film, for example, a polysilicon film is formed at the entire surface, a gate electrode 4 of 400 nm in thickness in which one end thereof extends on said N− type drain region 2 shown in FIG. 2 by patterning the polysilicon film using well-known patterning technique.

An N+ type source region 5 and an N+ type drain region 6 separated from the other end of the gate electrode 4 and included in said N− type drain region 2 are formed as shown in FIG. 2 by ion implanting phosphorus ion ($^{31}P^+$) with 80 KeV in acceleration voltage and about $6 \times 10^{15}/cm^2$ in implantation volume masking a photo-resist FR1.

Next, a middle concentration N type layer 7 is formed at from the other end of said gate electrode 4 to near an N+ drain region 6 included in said N− type drain region 2 as shown in FIG. 3 by ion-implanting phosphorus ion ($^{31}P^+$), for example, with 160 KeV in acceleration voltage and about $2\times10^{12}/cm^2$ in implantation volume masking a photo-resist (not shown) formed on said gate electrode 4. Here, said middle concentration N type layer is formed so as to have high impurity concentration peak at position of the predetermined depth in the substrate and so that impurity concentration becomes lower at region the nearer surface of the substrate by ion-implanting phosphorus ion ($^{31}P^+$) comparatively long in flying distance (comparing with arsenic ion and the like) with comparatively high acceleration energy (about 100 KeV to 200 KeV, in the embodiment, acceleration voltage of about 160 KeV) comparing with acceleration energy (80 KeV) at ion implantation for forming N+ type source and drain regions 5 and 6.

By the process, the N+ type drain region 6 can be surrounded by the middle concentration N type layer 7 with keeping concentration of a channel side drain region end portion in lower concentration by the N− type drain region 2.

Figure 5:
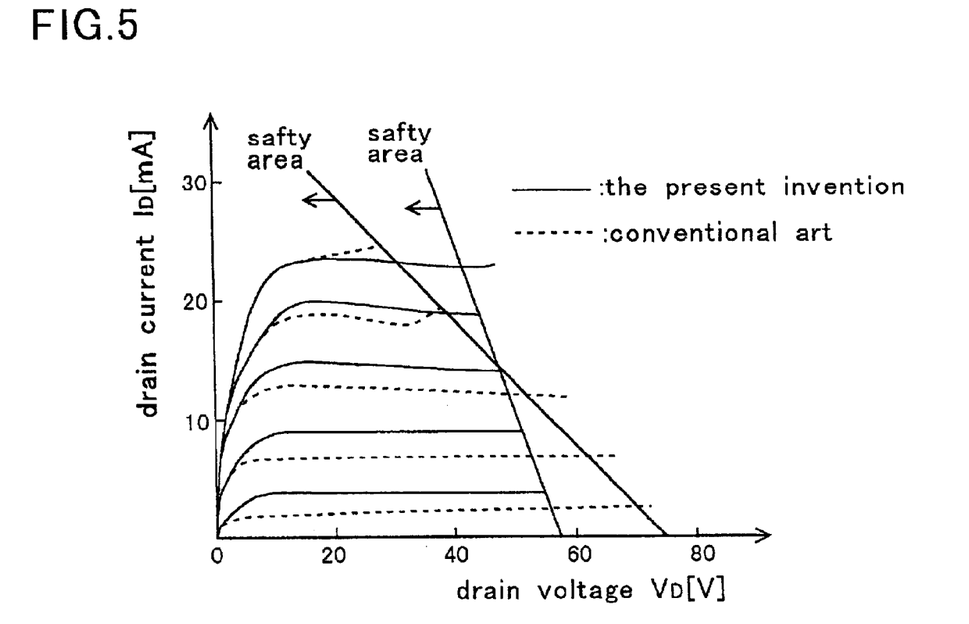
FIG. 5 is a view showing drain current (ID) vs. drain voltage (VD) of a semiconductor device of the invention and the conventional semiconductor device.

As described above, the semiconductor device of the invention removes double hump characteristic and can decrease substrate current (ISub) at high gate voltage (VG) region as shown with a solid line in FIG. 4 by surrounding said high concentration N+ type drain region 6 by the middle concentration N type layer 7 and by letting the depletion layer not extend to the N+ type drain region. Thus, operation sustaining voltage (VSUS) improves as shown in FIG. 5 and FIG. 6. Especially, sustaining voltage improves extremely at high gate voltage (VG) and high drain current (ID).

Next, a second embodiment of the invention will be described.

Figure 7:
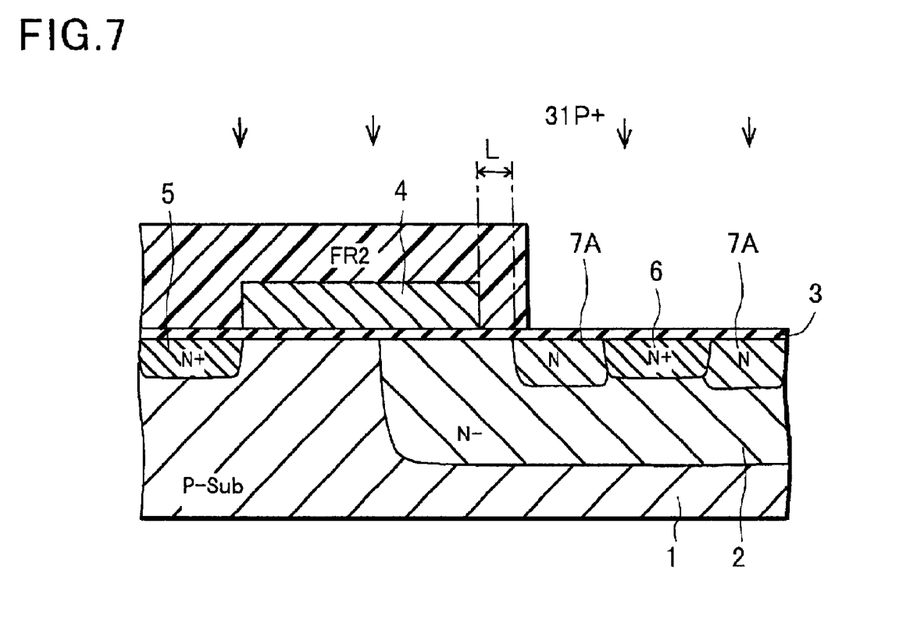
FIG. 7 is a section view showing a method of manufacturing a semiconductor device of a second embodiment of the present invention.

The characteristic of the semiconductor device of the second embodiment is that a middle concentration N type layer 7A is formed having the predetermined space (L) from one end portion (drain side) of said gate electrode 4 as shown in FIG. 7. Since electric field concentration at the end portion of the gate electrode 4 is controlled by forming the N type layer 7A having the predetermined space (L) from the end portion of the gate electrode 4, higher sustaining voltage is designed.

In the above-mentioned method of manufacturing the semiconductor device, a middle concentration N type layer 7A is formed near the N+ type drain region 6 included in said N− type drain region having the predetermined space (L) from the other end portion of said gate electrode 4 as shown in FIG. 7 by ion implanting phosphorus ion ($^{31}P^+$), for example, with about 160 KeV in acceleration voltage and about $2\times10^{12}/cm^2$ in implantation volume forming a photo-resist PR2 so as to overlap with the predetermined space from one end portion (drain side) of the gate electrode 4 after process in FIG. 1 and FIG. 2 described at the first embodiment. Therefore, a space from the gate electrode 4 (L) can be set freely by adjusting overlap quantity to the gate electrode 4 at forming the photo-resist PR2.

An another embodiment forming the above-mentioned middle concentration N type layer having the predetermined space from one end (drain side) of the gate electrode 4 will be described below.

Figure 8:
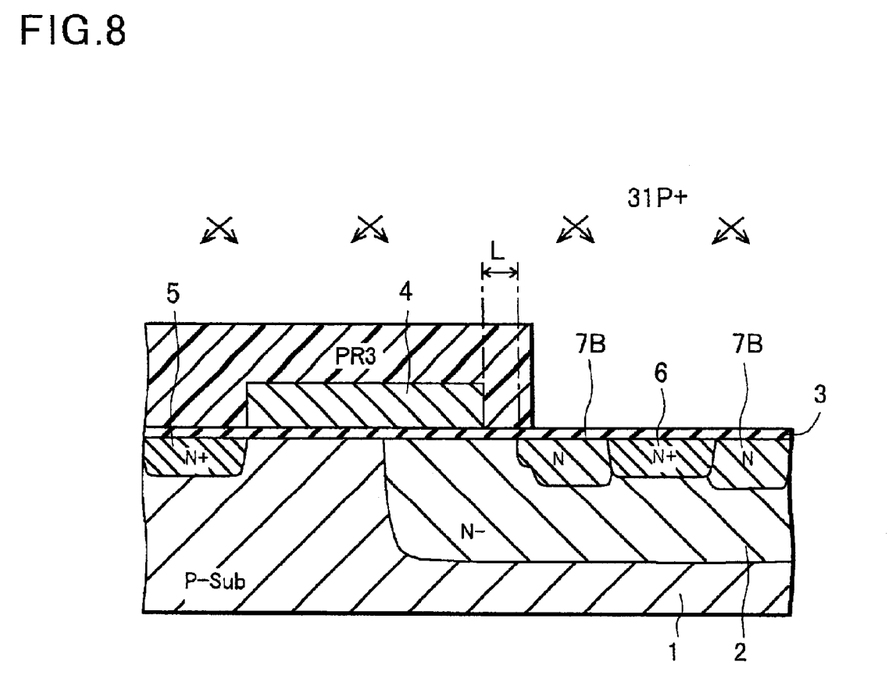
FIG. 8 is a section view showing a method of manufacturing a semiconductor device of a third embodiment of the present invention.

First, in a third embodiment, the above-mentioned construction is realized by ion implanting for N type layer forming from oblique upper side by using a photo-resist PR3 at patterning the gate electrode as a mask as shown in FIG. 8.

That is, after process of FIG. 7 described in the second embodiment, ion implantation for forming N type layer from oblique upper side by using a photoresist PR3 as a mask can be conducted.

Then, a middle concentration N type layer 7B is formed from near gate electrode 4 to the N+ type drain region 6 included in said N− type drain region 2 having the predetermined space (L) from the other end portion of said gate electrode 4 by ion-implanting phosphorus ion ($^{31}P^+$), for example, with about 160 KeV in acceleration voltage and about $2\times10^{12}/cm^2$ in implantation volume(doze) by using the photo-resist PR3 covering said gate electrode 4 as a mask so that impurity concentration gradually becomes higher from near gate electrode 4 to N+ type drain region 6.

Thus, in the third embodiment, since ion implantation is carried out using the photo-resist PR3 as a mask from oblique upper side, concentration deference between gate electrode 4 side ion-implanted from only oblique right upper, and a region ion-implanted from oblique right upper and oblique left upper side, is generated. Therefore a middle concentration N type layer 7B can be formed from near gate electrode 4 to the N+ type drain region 6 included in said N− type drain region 2 so that impurity concentration gradually becomes higher from near gate electrode 4 to N+ type drain region 6. And electric field concentration near the gate electrode, 4 can be prevented and higher sustaining voltage can be designed.

Here by controlling an angle of ion-implantation from oblique upper side(in this embodiment, angle between ion-implantation direction and perpendicular line for gate electrode 4 is 30 degree), a middle concentration N type layer 7B can be formed from near gate electrode 4 to the N+ type drain region 6 so that impurity concentration precisely is changed from near gate electrode 4 to N+ type drain region 6(impurity concentration can be classified according to multi levels precisely).

Next, a fourth embodiment will be described.

Figure 9:
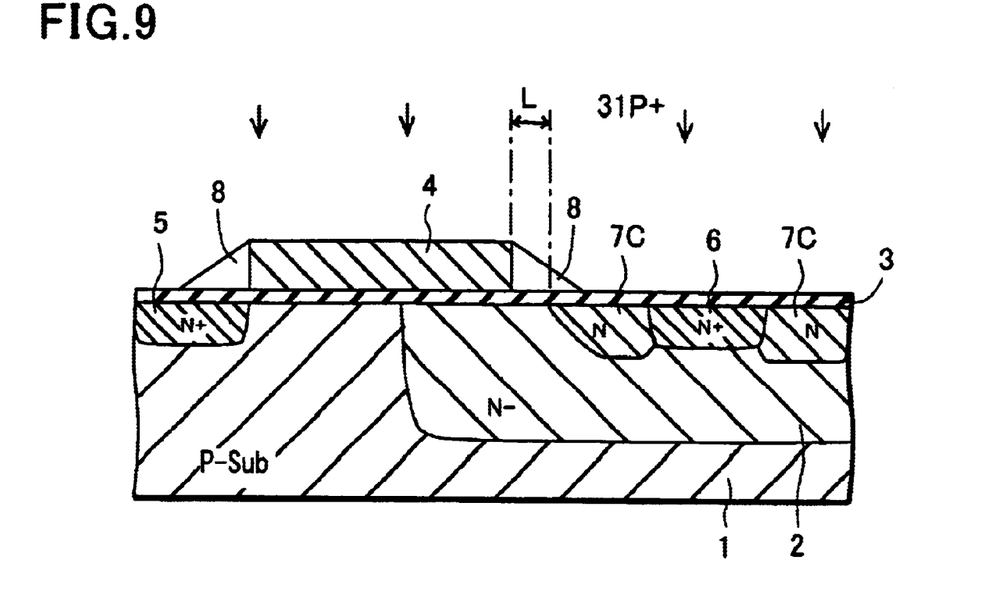
FIG. 9 is a section view showing a method of manufacturing a semiconductor device of a fourth embodiment of the present invention.

Here, a characteristic of the fourth embodiment is that the above-mentioned construction is realized by ion implanting for N type layer by using a tapered side wall insulation film 8 and a gate electrode 4 as a mask by forming the side wall insulation film 8 so as to cover a side wall portion of the gate electrode 4 after forming the gate electrode 4 as shown in FIG. 9.

That is, after process of FIG. 3 described in the first embodiment, an insulation film is formed by CVD method so as to cover the gate electrode on the gate insulation film 3. After that, a tapered side wall insulation film 8 having a modulate tapered portion is formed at a side wall portion of the gate electrode 4 by isotropic etching the insulation film 3.

Then, a middle concentration N type layer 7C is formed near the N+ type drain region 6 included in said N− type drain region having an impurity concentration which is gradually changed higher from the other end of said gate electrode 4 by ion-implanting phosphorus ion ($^{31}P^+$), for example, with about 160 KeV in acceleration voltage and about $2\times10^{12}/cm^2$ in implantation volume(doze) through said side wall insulation film 8 by using said gate electrode 4 as a mask.

Thus, in the fourth embodiment, since thickness gradation of the side wall insulation film 8 having a tapered shape formed at the side wall portion of the gate electrode 4 is used as a part of the mask instead of the photo-resists PR2 and PR3 such as the second and third embodiments, forming positioning margin of the N type layer against a gap of mask matching worried at using the photo-resists PR2 and PR3 can be ensured. Although, in the embodiment, the side wall insulating film is formed by patterning an insulating film by isotropic etching, anisotropic etching can be used.

Figure 14:
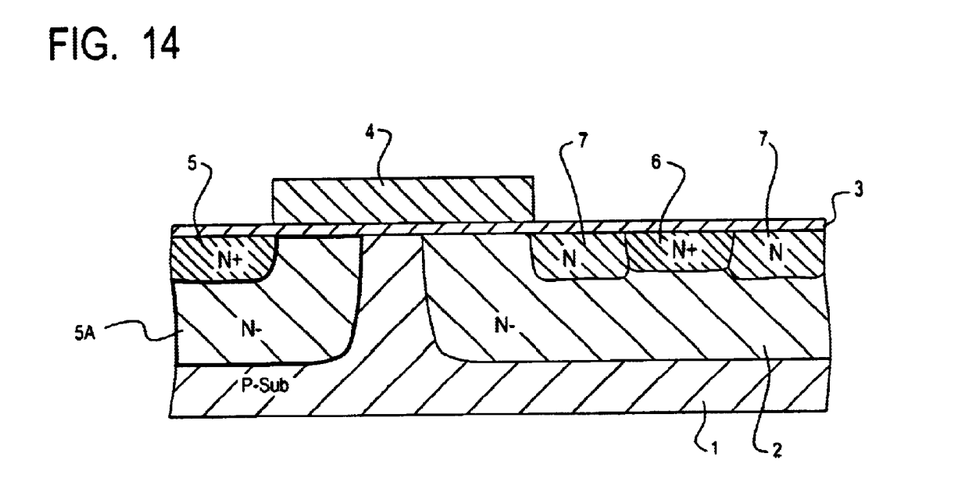
FIG. 14 is a section view showing a method of manufacturing a semiconductor device according to an embodiment of the present invention.

Although an example that the invention is applied to a semiconductor device having one side LDD construction (having low concentration drain region and high concentration drain region at only region side) in each of the above-mentioned embodiments is described, the invention may be applied to both side LDD construction (having low concentration drain region and high concentration drain region at both of source and drain sides). For example, FIG. 14 shows a device having a high concentration 5 source region formed in a low concentration source region 5A.

Further, although an example that the invention is applied for the N channel type MOS transistor in each of the above-mentioned embodiments, the invention may be applied for a P channel type MOS transistor.

Further in the above embodiment, instead of ion implantation, another method such as solid phase diffusion is applicable. For example, after forming a film containing an impurity on the drain region, the impurity from the film may be diffused.

Further instead of using photo resist PR2, PR3 or a side wall insulating film 8 in the above embodiments, by ion-implanting from oblique upper side of the gate electrode 4, an N type impurity region can be formed.

According to the invention, the semiconductor device has high impurity concentration at region where is separated from the other end of the gate electrode and spans to a high concentration reverse conductive type drain region included in a low concentration reverse conductive type drain region, and forms a middle concentration reverse conductive type layer being low near the gate electrode, higher sustaining voltage becomes possible.

What is claimed is:

1. A semiconductor device comprising:
   a semiconductor substrate of a first conductive type;
   a gate insulation film disposed over the semiconductor substrate;
   a gate electrode provided on the gate insulation film;
   a high concentration source region of a second conductive type disposed in the semiconductor substrate and at one end of said gate electrode;
   a low concentration drain region of the second conductive type disposed in the semiconductor substrate and provided to face said source region through a channel region;
   a high concentration drain region of the second conductive type spaced away from another end of said gate electrode and disposed in said low concentration drain region; and
   a middle concentration layer of the second conductive type disposed in said low concentration drain region and disposed at least from a predetermined position spaced away from said gate electrode to said high concentration drain region,
   wherein an impurity concentration of said middle concentration layer increases from near the gate electrode to near said high concentration drain region.

2. A semiconductor device according to claim 1, wherein said middle concentration layer is formed so that the impurity concentration gradually increases from said gate electrode to said high concentration drain region.

3. A semiconductor device according to claim 1, wherein said middle concentration layer is formed so that the impurity concentration increases step by step from said gate electrode to said high concentration drain region.

4. A semiconductor device according to claim 1, wherein said high concentration source region is formed in said low concentration source region.

5. A semiconductor device according to claim 4, wherein said middle concentration layer is formed at an entire region spanning from said gate electrode to said high concentration drain region.

6. A semiconductor device according to claim 1, wherein said middle concentration layer is formed at an entire region spanning from said gate electrode to said high concentration source/drain region.

* * * * *